(12) United States Patent
Nomura et al.

(10) Patent No.: US 12,113,030 B2
(45) Date of Patent: Oct. 8, 2024

(54) ELECTRONIC COMPONENT MODULE COMPRISING SHIELD AND SEALING RESIN COVERING ELECTRONIC COMPONENTS

(71) Applicant: Murata Manufacturing Co., Ltd., Nagaokakyo (JP)

(72) Inventors: Tadashi Nomura, Nagaokakyo (JP); Yoshihito Otsubo, Nagaokakyo (JP)

(73) Assignee: MURATA MANUFACTURING CO., LTD., Kyoto-fu (JP)

( * ) Notice: Subject to any disclaimer, the term of this patent is extended or adjusted under 35 U.S.C. 154(b) by 287 days.

(21) Appl. No.: 17/655,376

(22) Filed: Mar. 18, 2022

(65) Prior Publication Data
US 2022/0208690 A1 Jun. 30, 2022

Related U.S. Application Data

(63) Continuation of application No. PCT/JP2020/035348, filed on Sep. 17, 2020.

(30) Foreign Application Priority Data

Sep. 27, 2019 (JP) ................................ 2019-177512

(51) Int. Cl.
| | |
|---|---|
| H01L 23/552 | (2006.01) |
| H01L 23/13 | (2006.01) |
| H01L 23/498 | (2006.01) |
| H01L 25/16 | (2023.01) |
| H01L 25/18 | (2023.01) |
| H01Q 1/38 | (2006.01) |

(52) U.S. Cl.
CPC ............ *H01L 23/552* (2013.01); *H01L 23/13* (2013.01); *H01L 23/49838* (2013.01); *H01L 25/16* (2013.01); *H01L 25/18* (2013.01); *H01Q 1/38* (2013.01)

(58) Field of Classification Search
CPC ........... H01L 23/552; H01L 2924/3025; H01L 2223/6677; H01L 2924/15321; H01L 23/49816; H01L 2224/16227; H01L 2924/19106; H01L 2924/1531; H01Q 1/2283; H05K 9/0064
USPC ....................................................... 257/659
See application file for complete search history.

(56) References Cited

U.S. PATENT DOCUMENTS

| | | | |
|---|---|---|---|
| 9,935,083 B2 | 4/2018 | Lee et al. | |
| 2011/0298102 A1* | 12/2011 | Yoo ........................ | H01L 23/50 257/659 |
| 2013/0155639 A1 | 6/2013 | Ogawa et al. | |

(Continued)

FOREIGN PATENT DOCUMENTS

| | | |
|---|---|---|
| WO | 2012/023332 A1 | 2/2012 |
| WO | 2019/088174 A1 | 5/2019 |

OTHER PUBLICATIONS

International Search Report for PCT/JP2020/035348 dated Dec. 8, 2020.

*Primary Examiner* — Didarul A Mazumder
(74) *Attorney, Agent, or Firm* — Pearne & Gordon LLP

(57) ABSTRACT

A module substrate, a sealing resin portion, and a shield are provided. The shield is provided to cover each of the sealing resin portion and a peripheral side surface of the module substrate. The shield is connected to a ground electrode. On the peripheral side surface, the shield is separated into a first surface side and a second surface side.

20 Claims, 16 Drawing Sheets

(56) References Cited

U.S. PATENT DOCUMENTS

| | | |
|---|---|---|
| 2018/0269181 A1 | 9/2018 | Yang et al. |
| 2018/0323170 A1 | 11/2018 | Kim et al. |
| 2019/0067207 A1 | 2/2019 | Hu |
| 2020/0260581 A1 | 8/2020 | Nomura et al. |
| 2020/0335453 A1* | 10/2020 | Hong ................ H01L 23/49838 |

* cited by examiner

ELECTRONIC COMPONENT MODULE COMPRISING SHIELD AND SEALING RESIN COVERING ELECTRONIC COMPONENTS

CROSS REFERENCE TO RELATED APPLICATION

This is a continuation of International Application No. PCT/JP2020/035348 filed on Sep. 17, 2020, which claims priority from Japanese Patent Application No. 2019-177512 filed on Sep. 27, 2019. The contents of these applications are incorporated herein by reference in their entireties.

BACKGROUND OF THE DISCLOSURE

Field of the Disclosure

The present disclosure relates to an electronic component module.

Description of the Related Art

An electronic device (module) in which electronic components are mounted on opposing surfaces of a substrate has been known. In such a module, the mounted electronic components may radiate electromagnetic waves to the outside or electromagnetic waves may arrive from the outside, which may affect operations of the module.

A technique to suppress leakage of electromagnetic waves generated by the electronic components to the outside of the electronic device or arrival of electromagnetic waves from the outside by covering the electronic device with a shield is adopted as a method to suppress such influence by the electromagnetic waves.

U.S. Pat. No. 9,935,083 (PTL 1) discloses a configuration of an electronic device including electronic components such as semiconductors mounted on opposing surfaces of a substrate, for suppressing electromagnetic interference (EMI) by molding the electronic components on the substrate with a resin and forming a shield around the molded substrate.

In the configuration disclosed in U.S. Pat. No. 9,935,083 (PTL 1), the shield can prevent radiation of electromagnetic waves generated by the electronic components within the electronic device to the outside, and influence by external electromagnetic waves onto the mounted electronic components can be lessened.

PTL 1: U.S. Pat. No. 9,935,083

BRIEF SUMMARY OF THE DISCLOSURE

As in U.S. Pat. No. 9,935,083 (PTL 1), in such a structure that electronic components are mounted on the opposing surfaces of the substrate and the entire substrate including any of the opposing surfaces and a plurality of side surfaces that connect the opposing surfaces to each other is covered with a continuous shield, electromagnetic waves radiated from the electronic components mounted on one surface of the substrate may propagate to the other surface of the substrate through the shield arranged around the substrate and may affect the electronic components on the other surface side.

The present disclosure was made in view of the problems above, and an object thereof is to provide an electronic component module capable of achieving effective suppression of influence by electromagnetic waves.

An electronic component module based on the present disclosure includes a module substrate, a sealing resin portion, and a shield. The module substrate includes a first surface, a second surface located opposite to the first surface, and a peripheral side surface that connects the first surface and the second surface to each other. The electronic component is mounted on at least one of the first surface and the second surface. The sealing resin portion is provided on at least one of the first surface and the second surface, the electronic component being sealed with the sealing resin portion. The shield is provided to cover each of the sealing resin portion and the peripheral side surface. The module substrate is provided with a ground electrode. The shield is connected to the ground electrode. On the peripheral side surface, the shield is separated into a first surface side and a second surface side.

According to the present disclosure, influence by electromagnetic waves can effectively be suppressed.

DETAILED DESCRIPTION OF THE DISCLOSURE

Figure 1:
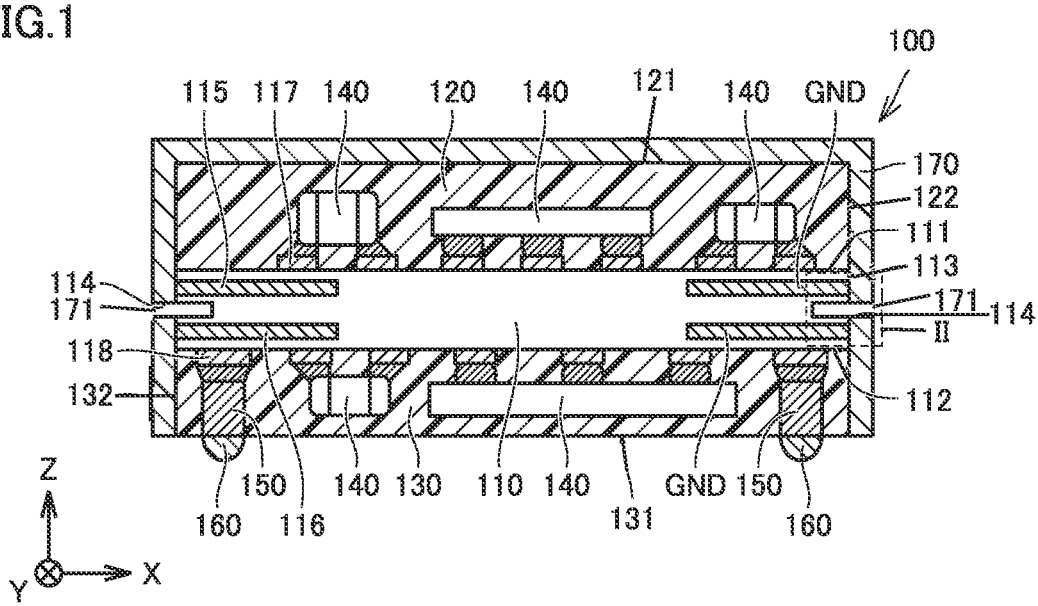
FIG. 1 is a cross-sectional view showing a configuration of an electronic component module according to a first embodiment of the present disclosure.

An electronic component module according to each embodiment of the present disclosure will be described below with reference to the drawings. In the description of the embodiment below, the same or corresponding elements in the drawings have the same reference characters allotted and description thereof will not be repeated.

First Embodiment

Figure 2:
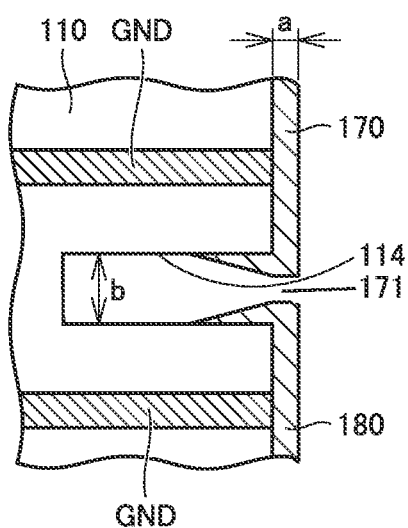
FIG. 2 is an enlarged partial cross-sectional view of a portion shown with II in FIG. 1.

FIG. 1 is a cross-sectional view showing a configuration of an electronic component module according to a first embodiment of the present disclosure. FIG. 2 is an enlarged partial cross-sectional view of a portion shown with II in FIG. 1. FIG. 1 shows one direction along a main surface of a module substrate 110 as an X-axis direction, a direction orthogonal to the X-axis direction in a plane of the main surface as a Y-axis direction, and a direction orthogonal to the main surface as a Z-axis direction.

As shown in FIG. 1, an electronic component module 100 according to the first embodiment of the present disclosure includes module substrate 110, sealing resin portions 120 and 130, a shield 170, and a connection terminal 160.

Module substrate 110 is in a multilayer structure, and it is a resin substrate composed of a resin such as a glass epoxy resin or a liquid crystal polymer or a ceramic substrate composed of ceramics such as low temperature co-fired ceramics (LTCC).

In the inside of module substrate 110, a ground electrode GND is provided. In the inside of module substrate 110, at least one of an interconnection pattern, an inductor, and a capacitor may further be provided. In other words, in the inside of module substrate 110, a conductor pattern for forming ground electrode GND, the interconnection pattern, the inductor, and the capacitor is formed.

The conductor pattern is composed of a conductive material such as copper (Cu), silver (Ag), or gold (Au), or a compound of these metals. Conductor patterns are electrically connected to each other through a not-shown via as necessary. The conductor pattern is electrically connected to an electronic component 140 mounted on module substrate 110 through a not-shown via.

Module substrate 110 includes a first surface 111 which is a main surface, a second surface 112 which is a main surface located opposite to first surface 111, and a peripheral side surface 113 that connects first surface 111 and second surface 112 to each other. Electronic component 140 is mounted on at least one of first surface 111 and second surface 112. In electronic component module 100 according to the present embodiment, a plurality of electronic components 140 are mounted on each of first surface 111 and second surface 112.

Specifically, an electrode terminal 117 is provided on first surface 111 of module substrate 110. Electronic component 140 is connected to electrode terminal 117 through solder. An electrode terminal 118 is provided on second surface 112 of module substrate 110. Electronic component 140 is connected to electrode terminal 118 through solder.

Electronic component 140 is, for example, a semiconductor element, a ceramic layered chip component, a resistive component, or a transformer. By mounting these electronic components 140, electronic component module 100 can function as a high-frequency module such as a Bluetooth® module, a wireless LAN module, or an antenna module.

Sealing resin portion 120 is provided on first surface 111. Sealing resin portion 130 is provided on second surface 112. In other words, in electronic component module 100 according to the present embodiment, sealing resin portions 120 and 130 are provided on first surface 111 and second surface 112, respectively. The sealing resin portion does not necessarily have to be provided on both of first surface 111 and second surface 112, and should only be provided on at least one of first surface 111 and second surface 112. In other words, at least one of sealing resin portion 120 and sealing resin portion 130 should only be provided.

Electronic component 140 mounted on first surface 111 is sealed with sealing resin portion 120. Electronic component 140 mounted on second surface 112 is sealed with sealing resin portion 130. Sealing resin portions 120 and 130 are composed of a sealing resin such as an epoxy resin containing a silica filler. In order to enhance thermal conductivity of sealing resin portions 120 and 130, alumina may be employed as the filler.

Sealing resin portion 120 includes a main surface 121 opposite to a surface on a module substrate 110 side and a peripheral side surface 122 adjacent to main surface 121.

Peripheral side surface 122 of sealing resin portion 120 is continuous to peripheral side surface 113 of module substrate 110.

Sealing resin portion 130 includes a main surface 131 opposite to a surface on the module substrate 110 side and a peripheral side surface 132 adjacent to main surface 131. Peripheral side surface 132 of sealing resin portion 130 is continuous to peripheral side surface 113 of module substrate 110.

Connection terminal 160 is provided on main surface 131 of sealing resin portion 130. In other words, connection terminal 160 is exposed at sealing resin portion 130. Electronic component module 100 is connected to a not-shown mount substrate at connection terminal 160.

Connection terminal 160 is electrically connected to module substrate 110 through a columnar conductor 150 formed from a conductive member such as copper. Power supply is applied or a signal is transmitted from the mount substrate through columnar conductor 150 to electronic component 140 mounted on module substrate 110. Electronic component 140 mounted on module substrate 110 is electrically connected to the ground electrode of the mount substrate through columnar conductor 150. The columnar conductor may be formed from a protruding electrode, a metal pin, or a plated layer. A solder bump may be employed as the columnar conductor.

Shield 170 is provided to cover each of sealing resin portions 120 and 130 and peripheral side surface 113 of module substrate 110. Specifically, shield 170 covers main surface 121 and peripheral side surface 122 of sealing resin portion 120. Shield 170 covers peripheral side surface 132 of sealing resin portion 130. Shield 170 covers a portion of peripheral side surface 113 of module substrate 110 except for a recess which will be described later. In electronic component module 100 according to the present embodiment, shield 170 does not cover main surface 131 of sealing resin portion 130.

In peripheral side surface 113 of module substrate 110, shield 170 is connected to ground electrode GND. Specifically, a portion of shield 170 that covers main surface 121 and peripheral side surface 122 of sealing resin portion 120 is electrically connected to ground electrode GND located on a first surface 111 side. A portion of shield 170 that covers peripheral side surface 132 of sealing resin portion 130 is electrically connected to ground electrode GND located on a second surface 112 side.

Shield 170 is composed of a conductive material. Shield 170 prevents electromagnetic waves radiated from electronic component 140 mounted on module substrate 110 from leaking to the outside of electronic component module 100 and electromagnetic waves from the outside of electronic component module 100 from arriving. In other words, by surrounding at least one electronic component 140 in electronic component module 100 with shield 170, EMI can be suppressed.

In peripheral side surface 113 of module substrate 110, at least one recess 114 located along first surface 111 or second surface 112 is provided. In electronic component module 100 according to the present embodiment, peripheral side surface 113 is provided with a surrounding groove as at least one recess 114, the surrounding groove extending around peripheral side surface 113 by one round. Recess 114 is not limited to the surrounding groove, and the recess may discontinuously be provided along first surface 111 or second surface 112, may be a groove that extends around peripheral side surface 113 by less than one round, or may be a zigzag groove as will be described later.

As shown in FIGS. 1 and 2, on peripheral side surface 113, shield 170 is separated into the first surface 111 side and the second surface 112 side by the surrounding groove as recess 114. In electronic component module 100 according to the present embodiment, shield 170 is divided into two parts by a first separation portion 171. In other words, a portion of shield 170 that covers main surface 121 and peripheral side surface 122 of sealing resin portion 120 and a portion of shield 170 that covers peripheral side surface 132 of sealing resin portion 130 are separate from each other. Without being limited to an example in which shield 170 is divided into two parts by first separation portion 171, shield 170 should only partially be separated into the first surface 111 side and the second surface 112 side by first separation portion 171.

From a point of view of reliable separation of shield 170 by first separation portion 171, as shown in FIG. 2, relation of $b>2a$ is preferably satisfied where a represents a thickness of shield 170 and b represents a width of recess 114.

Figure 3:
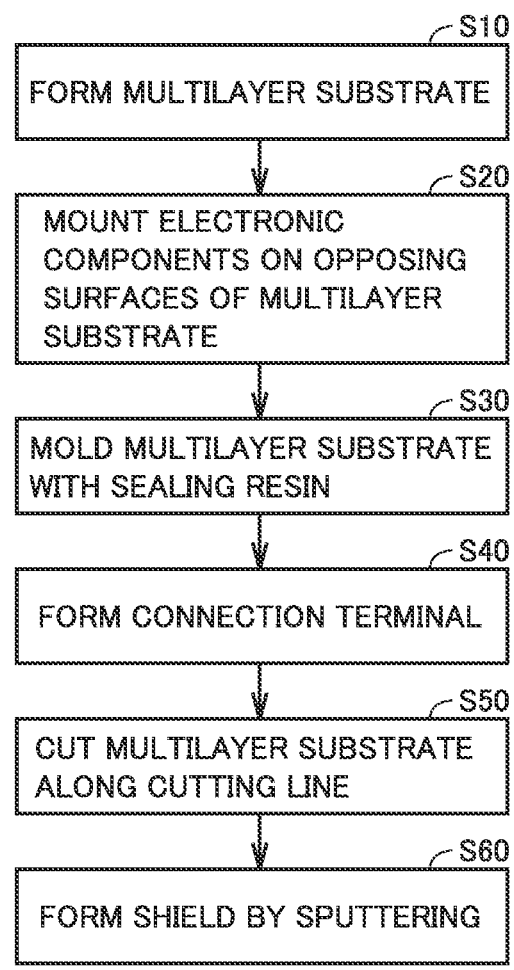
FIG. 3 is a flowchart for illustrating a method of manufacturing an electronic component module according to the first embodiment of the present disclosure.

A method of manufacturing electronic component module 100 according to the present embodiment will be described below. FIG. 3 is a flowchart for illustrating a method of manufacturing an electronic component module according to the first embodiment of the present disclosure.

Figure 4:
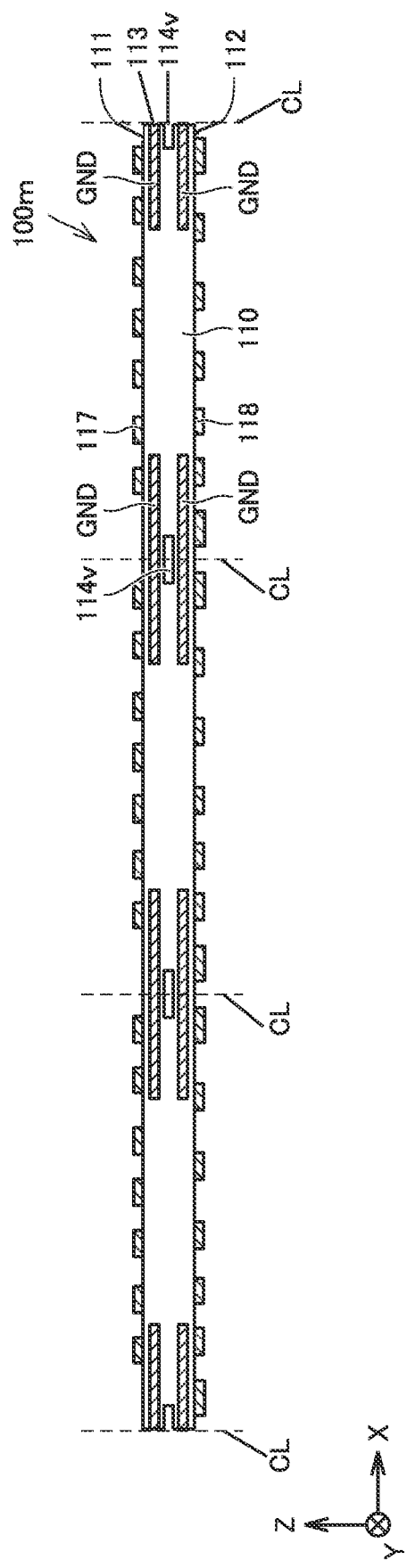
FIG. 4 is a cross-sectional view showing a structure of a multilayer substrate formed in the method of manufacturing an electronic component module according to the first embodiment of the present disclosure.

As shown in FIG. 3, initially, a multilayer substrate is formed (S10). FIG. 4 is a cross-sectional view showing a structure of the multilayer substrate formed in the method of manufacturing an electronic component module according to the first embodiment of the present disclosure. As shown in FIG. 4, a multilayer substrate 110*m* is a substrate assembly before individualization into a plurality of module substrates 110.

Multilayer substrate 110*m* is a resin substrate composed of a resin such as an epoxy resin or a liquid crystal polymer or a ceramic substrate composed of ceramics such as LTCC. When multilayer substrate 110*m* is a resin substrate, multilayer substrate 110*m* is formed by layering a plurality of resin layers each having one surface provided with a conductor pattern and by thermocompression bonding the resin layers. When multilayer substrate 110*m* is a ceramic substrate, multilayer substrate 110*m* is formed by layering a plurality of ceramic layers each having one surface provided with a conductor pattern and by firing the ceramic layers.

As shown in FIG. 4, in multilayer substrate 110*m*, a void 114*v* located on a cutting line CL which is a position of cutting in individualization of multilayer substrate 110*m* into a plurality of module substrates 110 is provided. When viewed in a direction orthogonal to first surface 111, cutting line CL is in grids.

When multilayer substrate 110*m* is a resin substrate, void 114*v* can be provided by providing an opening in each of a first resin layer and a second resin layer included in the plurality of resin layers. Specifically, when viewed in the direction orthogonal to first surface 111, by layering over the first resin layer in which first openings are intermittently provided on cutting line CL, the second resin layer in which second openings are intermittently provided to partially be superimposed on the first openings on cutting line CL, the first openings communicate with the second openings so that void 114*v* continuous on cutting line CL can be provided.

When multilayer substrate 110*m* is a ceramic substrate, void 114*v* can be provided by providing a resin pattern along cutting line CL between a first ceramic layer and a second ceramic layer included in a plurality of ceramic layers. A portion where the resin pattern is burnt in firing becomes void 114*v*.

In order to emit gas generated when the resin pattern is burnt, the resin pattern is preferably provided to continue to the peripheral side surface of multilayer substrate 110m. In this case, a gas outlet is created by burning of the resin pattern exposed at the peripheral side surface of multilayer substrate 110m, so that gas can be emitted to the outside of multilayer substrate 110m through the outlet. If gas is confined in a closed space within multilayer substrate 110m, gas expands during firing and multilayer substrate 110m may thereby be damaged. Therefore, gas is preferably emitted to the outside of multilayer substrate 110m. By providing the gas outlet in the peripheral side surface of multilayer substrate 110m, entry of the sealing resin into void 114v and resultant filling of void 114v can be suppressed. If the gas outlet opens in first surface 111 or second surface 112, the sealing resin flows into void 114v through the outlet and at least a part of void 114v is filled.

Figure 5:
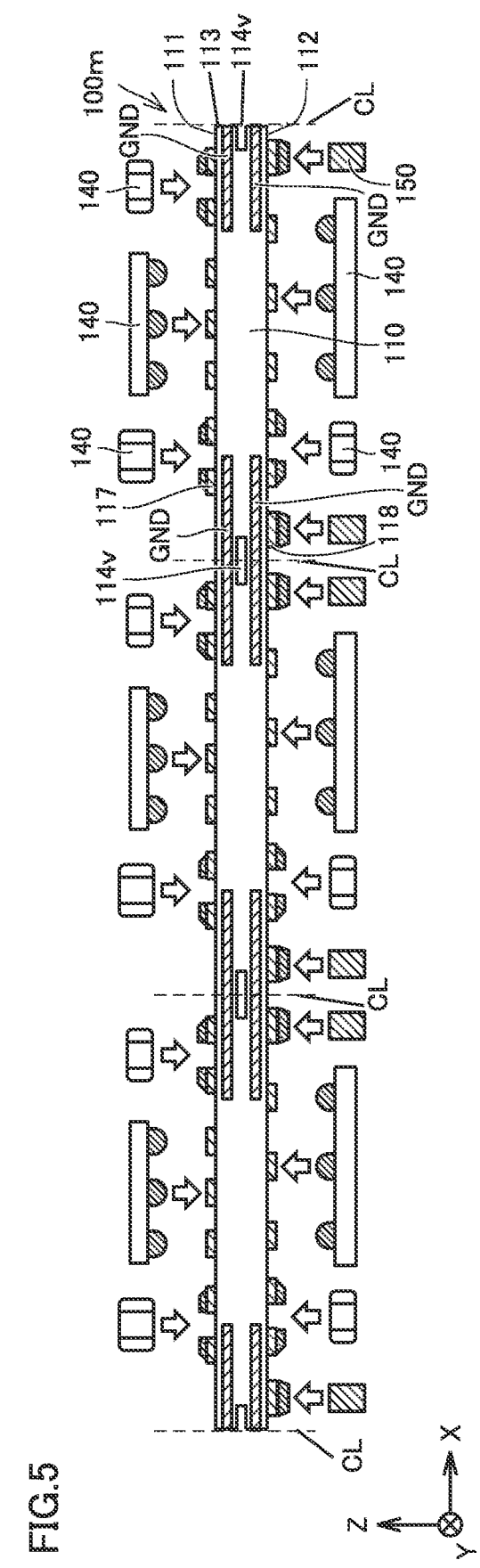
FIG. 5 is a diagram showing a state that an electronic component and a columnar conductor are mounted on the multilayer substrate in the method of manufacturing an electronic component module according to the first embodiment of the present disclosure.

Then, as shown in FIG. 3, electronic component 140 is mounted on both of first surface 111 and second surface 112 of multilayer substrate 110m and columnar conductor 150 is mounted on second surface 112 (S20). FIG. 5 is a diagram showing a state that the electronic component and the columnar conductor are mounted on the multilayer substrate in the method of manufacturing an electronic component module according to the first embodiment of the present disclosure.

As shown in FIG. 5, electronic component 140 is mounted on electrode terminal 117 provided on first surface 111 of multilayer substrate 110m, with solder being interposed. Similarly, electronic component 140 and columnar conductor 150 are mounted on electrode terminal 118 provided on second surface 112 of multilayer substrate 110m, with solder being interposed. Thereafter, by melting solder by heating in a reflow step, electronic components 140 are bonded to electrode terminals 117 and 118. As necessary, multilayer substrate 110m may be cleaned after reflowing.

In a step of mounting electronic component 140 (S20), mounting on first surface 111 of multilayer substrate 110m and mounting on second surface 112 of multilayer substrate 110m may simultaneously be carried out, or after mounting on one surface is completed, mounting on another surface may be carried out. Columnar conductor 150 may be formed by plating or the like in a step of forming multilayer substrate 110m (S10) or by providing a conductor in an opening provided in the sealing resin after a molding step (S30) which will be described later.

Figure 6:
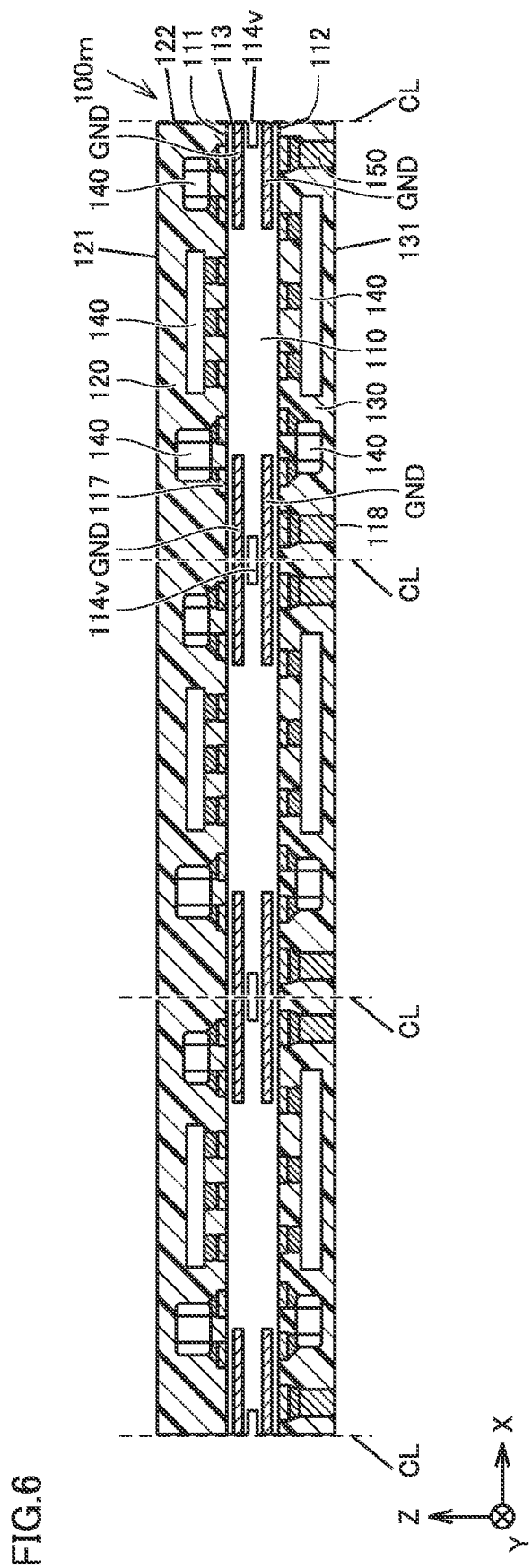
FIG. 6 is a diagram showing a state that the multilayer substrate is molded with a sealing resin in the method of manufacturing an electronic component module according to the first embodiment of the present disclosure.

Then, as shown in FIG. 3, the multilayer substrate is molded with the sealing resin (S30). FIG. 6 is a diagram showing a state that the multilayer substrate is molded with the sealing resin in the method of manufacturing an electronic component module according to the first embodiment of the present disclosure.

As shown in FIG. 6, sealing resin portion 120 is provided on first surface 111 of multilayer substrate 110m to cover electronic components 140, and sealing resin portion 130 is provided on second surface 112 of multilayer substrate 110m to cover electronic components 140.

A known method such as compression molding, transfer molding, liquid resin molding, or sheet resin molding can be employed as a molding method.

In the molding step (S30), first surface 111 and second surface 112 of multilayer substrate 110m may collectively be molded, or the surfaces may be molded one by one. As necessary, multilayer substrate 110m may be cleaned with plasma before the molding step (S30).

Figure 7:
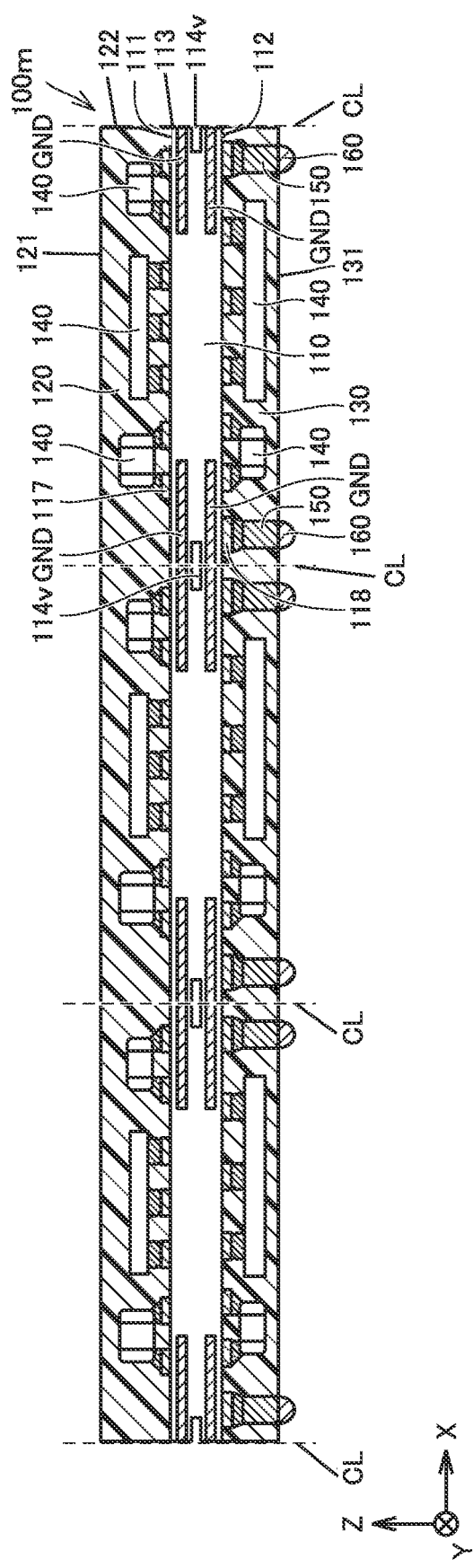
FIG. 7 is a diagram showing a state that a connection terminal is formed in the method of manufacturing an electronic component module according to the first embodiment of the present disclosure.

Then, as shown in FIG. 3, a connection terminal is formed (S40). FIG. 7 is a diagram showing a state that the connection terminal is formed in the method of manufacturing an electronic component module according to the first embodiment of the present disclosure.

An end surface of columnar conductor 150 is exposed at sealing resin portion 130, and connection terminal 160 is formed on the end surface. A step of exposing the end surface of columnar conductor 150 is performed by grinding main surface 131 of sealing resin portion 130. Alternatively, the step may be performed by providing an opening in a part of sealing resin portion 130 that covers columnar conductor 150 with the use of a drill or laser. Connection terminal 160 is made, for example, from a solder bump. The solder bump can be formed by melting in a reflow step, a solder paste printed with the use of a mask.

Figure 8:
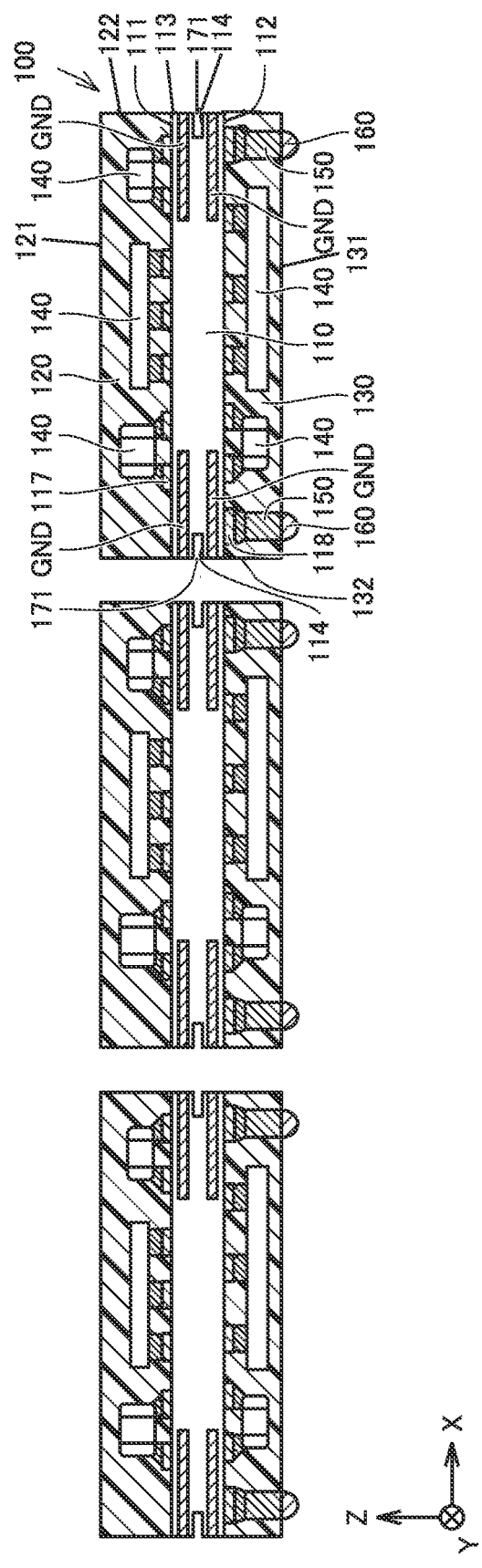
FIG. 8 is a diagram showing a state that the multilayer substrate is cut along a cutting line in the method of manufacturing an electronic component module according to the first embodiment of the present disclosure.

Then, as shown in FIG. 3, the multilayer substrate is cut along cutting line CL (S50). FIG. 8 is a diagram showing a state that the multilayer substrate is cut along the cutting line in the method of manufacturing an electronic component module according to the first embodiment of the present disclosure.

By cutting multilayer substrate 110m along cutting line CL with the use of a dicer or a laser cutter, the multilayer substrate is individualized into a plurality of module substrates 110 as shown in FIG. 8.

An end surface of ground electrode GND is exposed at peripheral side surface 113 of each of the plurality of module substrates 110. Void 114v is exposed as recess 114 at peripheral side surface 113 of each of the plurality of module substrates 110.

Figure 9:
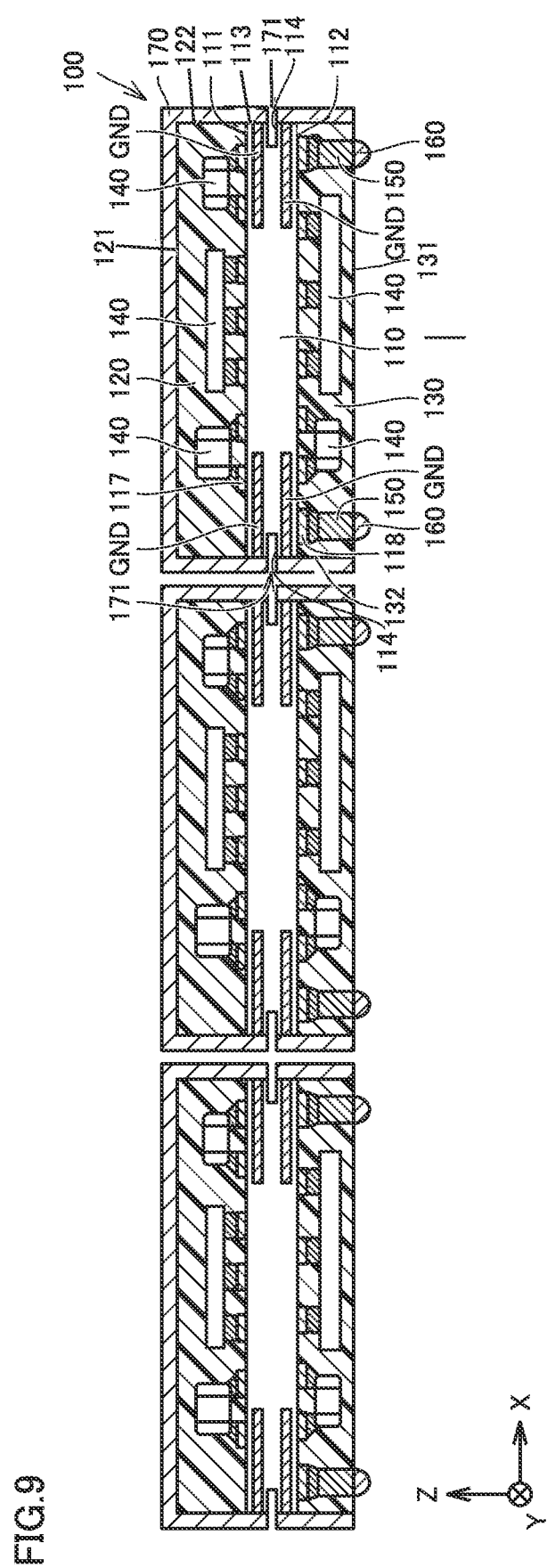
FIG. 9 is a diagram showing a state that a shield is formed by sputtering in the method of manufacturing an electronic component module according to the first embodiment of the present disclosure.

Then, as shown in FIG. 3, the shield is formed by sputtering (S60). FIG. 9 is a diagram showing a state that the shield is formed by sputtering in the method of manufacturing an electronic component module according to the first embodiment of the present disclosure.

By carrying out sputtering while main surface 131 of sealing resin portion 130 is held as being covered, for example, with an adhesive sheet, as shown in FIG. 9, shield 170 is formed to cover main surface 121 and peripheral side surface 122 of sealing resin portion 120 and peripheral side surface 132 of sealing resin portion 130.

Shield 170 is connected to ground electrode GND at peripheral side surface 113 of module substrate 110. On peripheral side surface 113 of module substrate 110, shield 170 is separated into the first surface 111 side and the second surface 112 side by recess 114. Specifically, since substantially no conductive material that forms shield 170 enters recess 114 during sputtering, a position where no shield 170 is provided over recess 114 serves as first separation portion 171.

From a point of view of reliable separation of shield 170 by first separation portion 171 as above, relation of b>2a is preferably satisfied where a represents a thickness of shield 170 and b represents a width of recess 114 as shown in FIG. 2. Connection of a portion of shield 170 located on the first surface 111 side and a portion of shield 170 located on the second surface 112 side to each other to close recess 114 in peripheral side surface 113 of module substrate 110 can thus be suppressed.

Shield 170 can have thickness a, for example, not smaller than 2 μm. Shield 170 may be constituted of a plurality of layers, and can be constituted, for example, of three layers of an intimate contact layer, a conductive layer, and a corrosion resistant layer.

A method of forming shield 170 is not limited to sputtering, and another physical film formation method such as vapor deposition may be employed.

Electronic component module 100 can be manufactured through a series of steps above.

In electronic component module 100 according to the present embodiment, on peripheral side surface 113, shield 170 is separated into the first surface 111 side and the second surface 112 side by at least one recess 114. Transmission of electromagnetic waves generated by electronic component 140 mounted on first surface 111 of module substrate 110 to electronic component 140 mounted on second surface 112 through shield 170 can be suppressed. Similarly, electromagnetic waves generated by electronic component 140 mounted on second surface 112 of module substrate 110 to electronic component 140 mounted on first surface 111 through shield 170 can be suppressed. Therefore, EMI can effectively be suppressed.

In electronic component module 100 according to the present embodiment, shield 170 is connected to ground electrode GND at peripheral side surface 113 of module substrate 110. Electromagnetic waves captured by shield 170 can thus be prevented from being radiated again from shield 170. Since an interconnection for connection between ground electrode GND and shield 170 does not have to be arranged on first surface 111 or second surface 112 of module substrate 110, a space occupied by the interconnection on each of first surface 111 and second surface 112 of module substrate 110 can be made smaller, and shield 170 can readily be set to a ground potential without connection of the interconnection.

In electronic component module 100 according to the present embodiment, peripheral side surface 113 is provided with a surrounding groove as at least one recess 114, the surrounding groove extending around peripheral side surface 113 by one round. A portion of shield 170 that covers main surface 121 and peripheral side surface 122 of sealing resin portion 120 and a portion of shield 170 that covers peripheral side surface 132 of sealing resin portion 130 can thus completely be separate from each other.

Therefore, transmission of electromagnetic waves generated by electronic component 140 mounted on first surface 111 of module substrate 110 to electronic component 140 mounted on second surface 112 through shield 170 can effectively be suppressed. Similarly, transmission of electromagnetic waves generated by electronic component 140 mounted on second surface 112 of module substrate 110 to electronic component 140 mounted on first surface 111 through shield 170 can effectively be suppressed. Therefore, EMI can further effectively be suppressed.

In electronic component module 100 according to the present embodiment, a plurality of electronic components 140 are mounted on each of first surface 111 and second surface 112, and sealing resin portions 120 and 130 are provided on first surface 111 and second surface 112, respectively. Mutual influence by electromagnetic waves radiated from electronic components 140 mounted on opposing surfaces of module substrate 110 can thus be suppressed.

A modification of the first embodiment of the present disclosure in which a sacrificial layer portion is provided instead of void 114v when multilayer substrate 110m is a resin substrate will be described.

Figure 10:
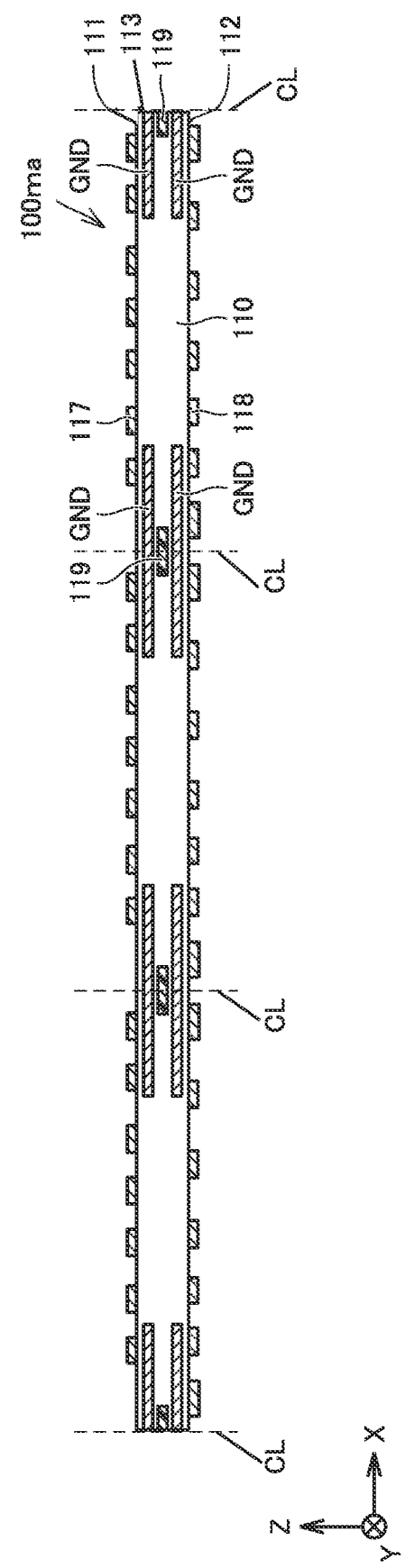
FIG. 10 is a cross-sectional view showing a structure of a multilayer substrate formed in the method of manufacturing an electronic component module according to a modification of the first embodiment of the present disclosure.

FIG. 10 is a cross-sectional view showing a structure of a multilayer substrate formed in the method of manufacturing an electronic component module according to a modification of the first embodiment of the present disclosure. FIG. 10 shows the structure in a cross-section identical to that in FIG. 4.

As shown in FIG. 10, in a multilayer substrate 110ma according to the modification of the first embodiment of the present disclosure, a sacrificial layer portion 119 is provided instead of void 114v. Sacrificial layer portion 119 is composed of a photosensitive resist, a water-soluble resin, or the like. Sacrificial layer portion 119 is exposed at peripheral side surface 113 of module substrate 110 at the time of individualization of multilayer substrate 110ma.

Recess 114 can be provided by cleaning module substrate 110 with a solvent or the like to dissolve and remove sacrificial layer portion 119. When sacrificial layer portion 119 is composed of the water-soluble resin, sacrificial layer portion 119 can be dissolved by cutting water in individualization of multilayer substrate 110ma, and hence recess 114 can be provided in module substrate 110 without cleaning of module substrate 110 with a solvent or the like.

Second Embodiment

An electronic component module according to a second embodiment of the present disclosure will be described below with reference to the drawings. The electronic component module according to the second embodiment of the present disclosure is different from electronic component module 100 according to the first embodiment of the present disclosure mainly in that the shield also covers a part of main surface 131 of sealing resin portion 130. Therefore, description of features similar to those in electronic component module 100 according to the first embodiment of the present disclosure will not be repeated.

Figure 11:
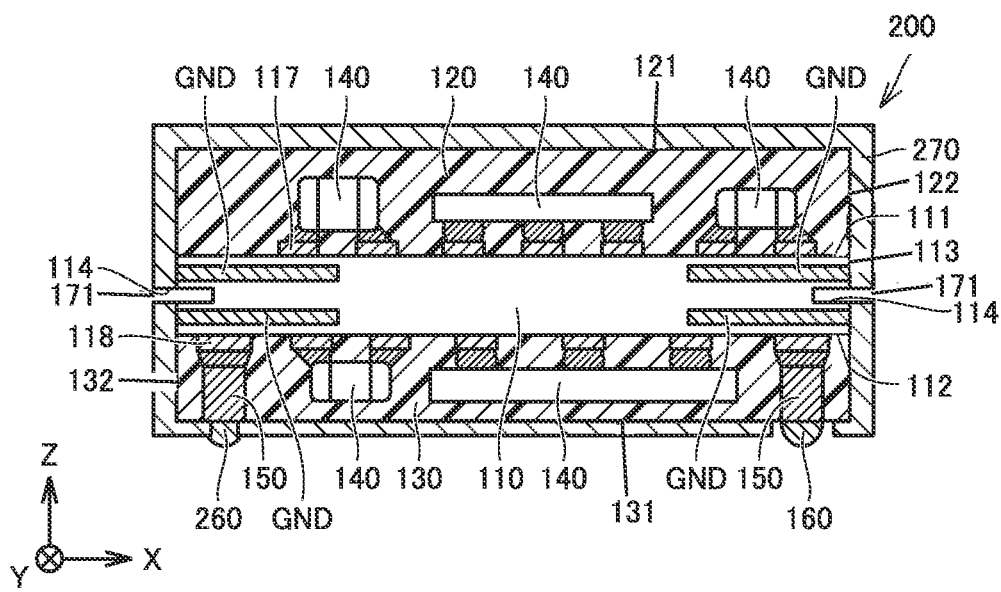
FIG. 11 is a cross-sectional view showing a configuration of an electronic component module according to a second embodiment of the present disclosure.

FIG. 11 is a cross-sectional view showing a configuration of the electronic component module according to the second embodiment of the present disclosure. FIG. 11 shows the configuration in a cross-section identical to that in FIG. 1.

As shown in FIG. 11, in an electronic component module 200 according to the second embodiment of the present disclosure, a shield 270 also covers a part of main surface 131 of sealing resin portion 130. Connection terminal 160 and a ground terminal 260 are provided on main surface 131 of sealing resin portion 130.

A portion of shield 270 located on main surface 131 of sealing resin portion 130 is connected to ground terminal 260 while it is distant from connection terminal 160.

In electronic component module 200 according to the second embodiment of the present disclosure, shield 270 also covers a part of main surface 131 of sealing resin portion 130. Therefore, influence by electromagnetic waves generated in a mount substrate onto electronic component 140 mounted on second surface 112 while electronic component module 200 is mounted on the mount substrate at connection terminal 160 can be lessened.

Third Embodiment

An electronic component module according to a third embodiment of the present disclosure will be described below with reference to the drawings. The electronic component module according to the third embodiment of the present disclosure is different from electronic component module 100 according to the first embodiment of the present disclosure mainly in that the shield is separated also in the sealing resin portion. Therefore, description of features similar to those in electronic component module 100 according to the first embodiment of the present disclosure will not be repeated.

Figure 12:
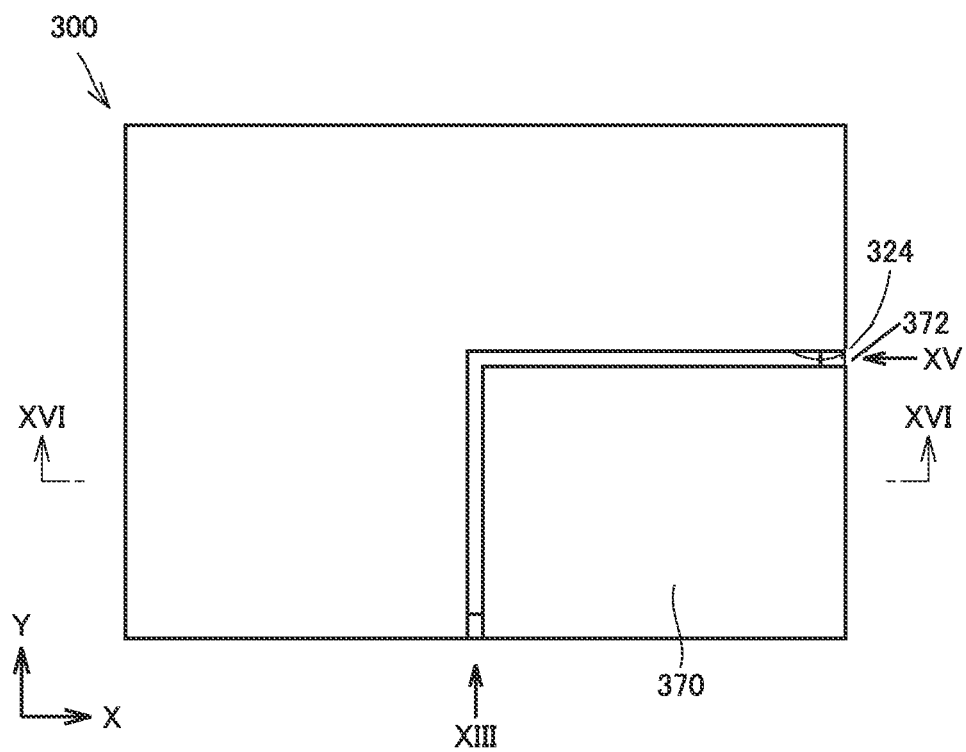
FIG. 12 is a plan view showing a configuration of an electronic component module according to a third embodiment of the present disclosure.
Figure 13:
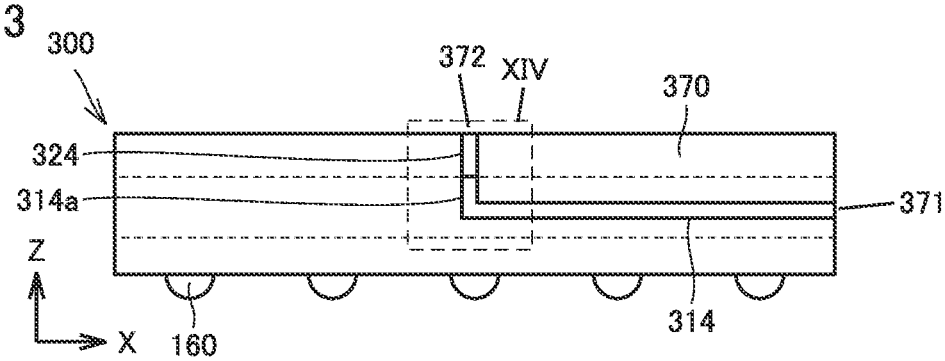
FIG. 13 is a diagram of the electronic component module in FIG. 12 viewed in a direction shown with XIII
Figure 14:
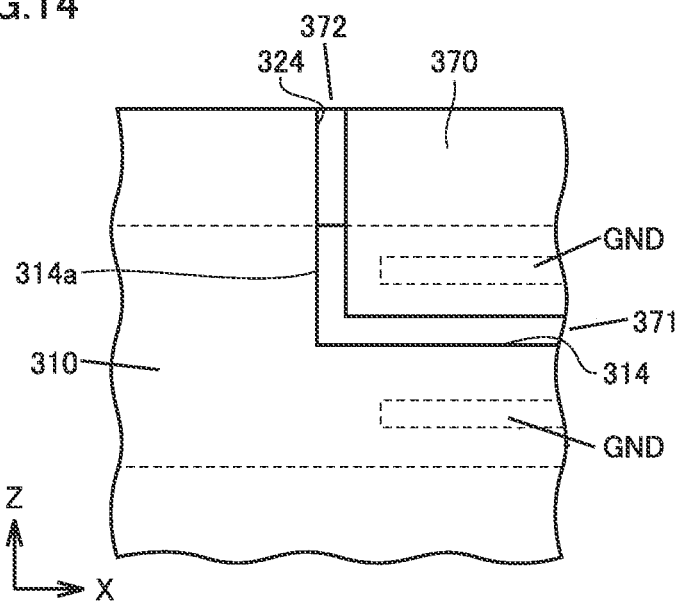
FIG. 14 is an enlarged view of a portion shown with XIV in FIG. 13.
Figure 15:
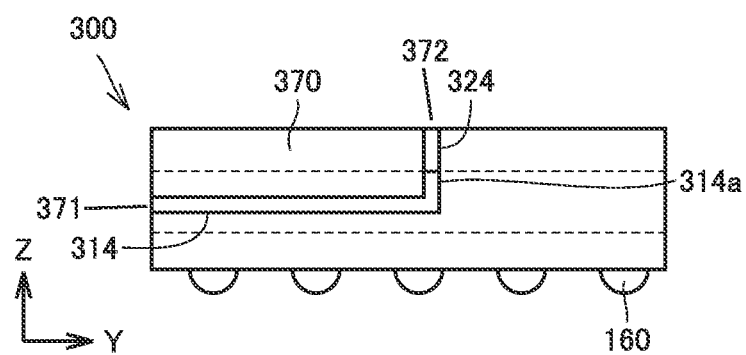
FIG. 15 is a diagram of the electronic component module in FIG. 12 viewed in a direction shown with XV.
Figure 16:
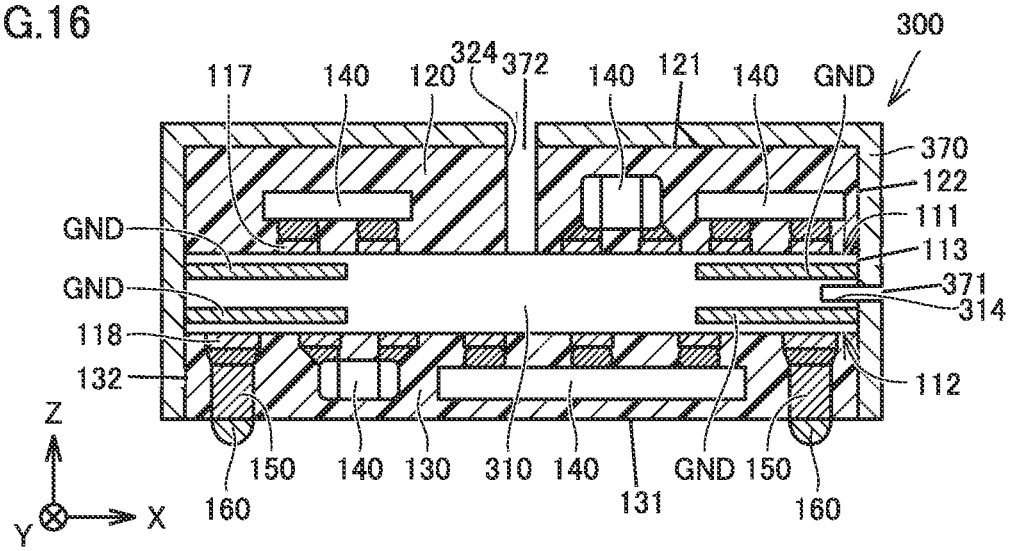
FIG. 16 is a cross-sectional view of the electronic component module in FIG. 12 in a direction shown with an arrow XVI-XVI.

FIG. 12 is a plan view showing a configuration of the electronic component module according to the third embodiment of the present disclosure. FIG. 13 is a diagram of the electronic component module in FIG. 12 viewed in a direction shown with XIII FIG. 14 is an enlarged view of a portion shown with XIV in FIG. 13. FIG. 15 is a diagram of the electronic component module in FIG. 12 viewed in a direction shown with XV. FIG. 16 is a cross-sectional view of the electronic component module in FIG. 12 viewed in a direction shown with an arrow XVI-XVI.

As shown in FIGS. 12 to 16, in an electronic component module 300 according to the third embodiment of the present disclosure, at least one groove 324 is provided in sealing resin portion 120. On sealing resin portion 120, a shield 370 is separated by at least one groove 324.

As shown in FIGS. 13 to 16, in peripheral side surface 113 of a module substrate 310, a groove that extends around peripheral side surface 113 by less than one round is provided as a recess 314 along first surface 111 or second surface 112.

As shown in FIGS. 13 to 15, in peripheral side surface 113 of module substrate 310, a connection groove that reaches first surface 111 from each of opposing ends of recess 314 is further provided as a recess 314a. Though recess 314a extends in the direction orthogonal to first surface 111 in electronic component module 300 according to the third embodiment of the present disclosure, it may extend in a direction diagonally intersecting with first surface 111.

As shown in FIGS. 12 to 16, sealing resin portion 120 is provided with groove 324 as being continuous to two recesses 314a. Recess 314, two recesses 314a, and groove 324 thus communicate with one another.

Shield 370 is separated into the first surface 111 side and the second surface 112 side by recess 314 in peripheral side surface 113 of module substrate 310.

Shield 370 is separated in the direction along first surface 111 by groove 324 in sealing resin portion 120.

On peripheral side surface 113 of module substrate 310, shield 370 is separated in the direction along first surface 111 by recess 314a. In other words, a first separation portion 371 and a second separation portion 372 divide shield 370 into two parts. First separation portion 371 is a position where shield 370 is not formed over recess 314, and second separation portion 372 is a position where shield 370 is not formed over recess 314a and groove 324.

A known method such as dicing or laser cutting can be employed as a method of providing groove 324 in sealing resin portion 120. In the event that shield 370 is formed to cover groove 324, a portion of shield 370 located above groove 324 is removed with the use of laser or the like.

In electronic component module 300 according to the third embodiment of the present disclosure, sealing resin portion 120 is provided with at least one groove 324, and on sealing resin portion 120, shield 370 is separated by at least one groove 324.

Transmission of electromagnetic waves generated by electronic component 140 mounted on first surface 111 of module substrate 310 to electronic component 140 mounted on second surface 112 through shield 370 can thus be suppressed. Similarly, transmission of electromagnetic waves generated by electronic component 140 mounted on second surface 112 of module substrate 310 to electronic component 140 mounted on first surface 111 through shield 370 can be suppressed.

Furthermore, transmission of electromagnetic waves generated by electronic component 140 mounted on one side of first surface 111 with groove 324 being interposed to electronic component 140 mounted on the other side of first surface 111 through shield 370 can be suppressed. Similarly, transmission of electromagnetic waves generated by electronic component 140 mounted on the other side of first surface 111 with groove 324 being interposed to electronic component 140 mounted on one side of first surface 111 through shield 370 can be suppressed.

Therefore, EMI can effectively be suppressed also in electronic component module 300 according to the third embodiment of the present disclosure.

The recess that extends in the direction intersecting with first surface 111 is not limited to a linearly extending recess, or not limited to a recess that reaches first surface 111.

Figure 17:
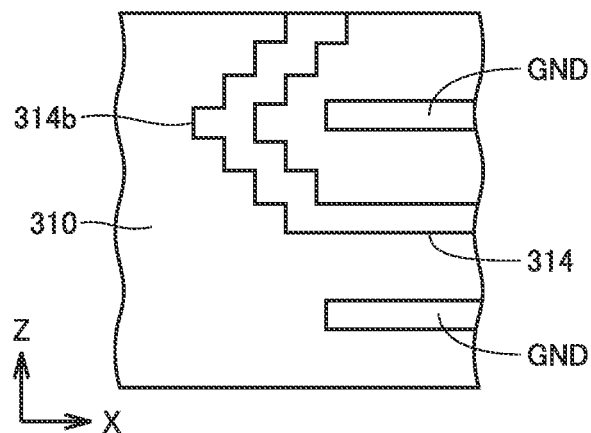
FIG. 17 is an enlarged view of a part of the peripheral side surface of the module substrate of the electronic component module according to a first modification of the third embodiment of the present disclosure.

FIG. 17 is an enlarged view of a part of the peripheral side surface of the module substrate of the electronic component module according to a first modification of the third embodiment of the present disclosure. As shown in FIG. 17, a stepped recess 314b that reaches first surface 111 from an end of recess 314 may be provided. Thus, at least one recess may include a portion that extends in the plane direction of module substrate 310 and a portion that extends in the thickness direction of module substrate 310.

Figure 18:
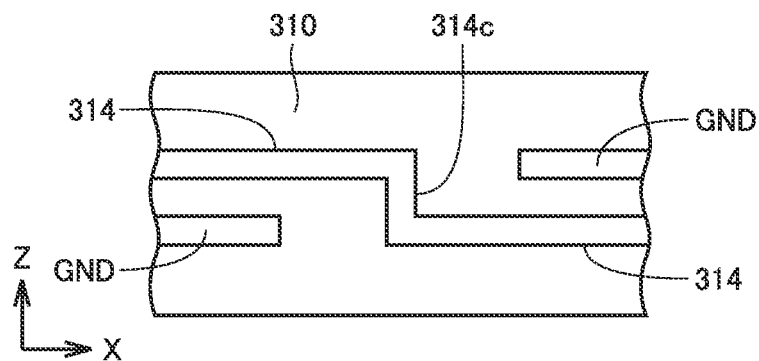
FIG. 18 is an enlarged view of a part of the peripheral side surface of the module substrate of the electronic component module according to a second modification of the third embodiment of the present disclosure.

FIG. 18 is an enlarged view of a part of the peripheral side surface of the module substrate of the electronic component module according to a second modification of the third embodiment of the present disclosure. As shown in FIG. 18, a recess 314c may be provided to connect two recesses 314 at different positions in the direction orthogonal to first surface 111 to each other.

Fourth Embodiment

An electronic component module according to a fourth embodiment of the present disclosure will be described below with reference to the drawings. The electronic component module according to the fourth embodiment of the present disclosure is different from electronic component module 300 according to the third embodiment of the present disclosure mainly in that the shield is partially separated. Therefore, description of features similar to those in electronic component module 300 according to the third embodiment of the present disclosure will not be repeated.

Figure 19:
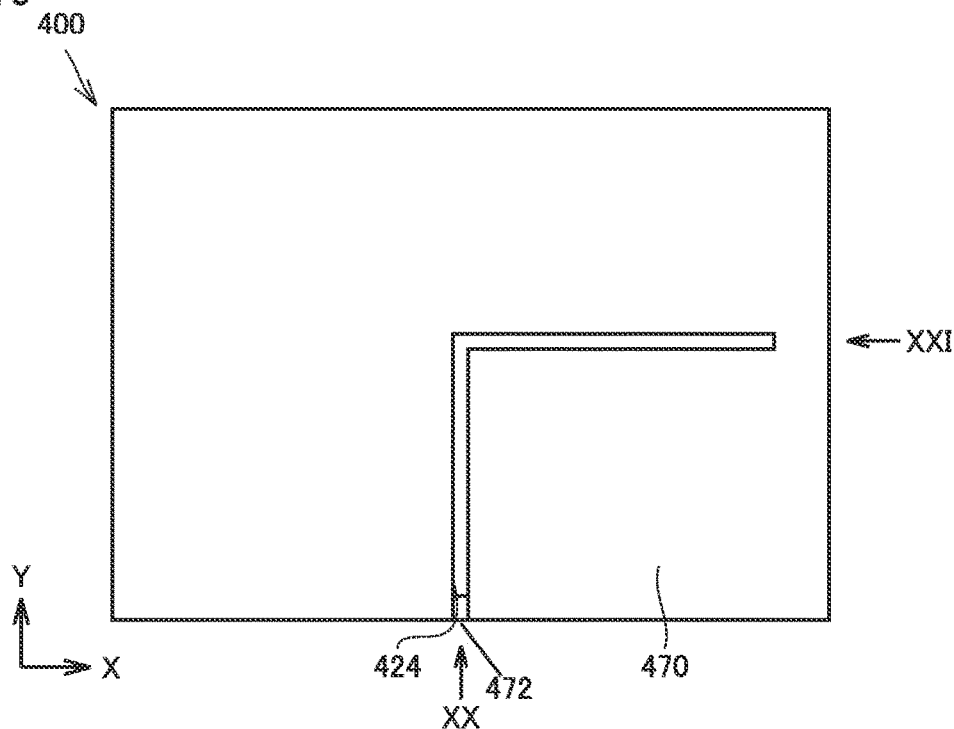
FIG. 19 is a plan view showing a configuration of an electronic component module according to a fourth embodiment of the present disclosure.
Figure 20:
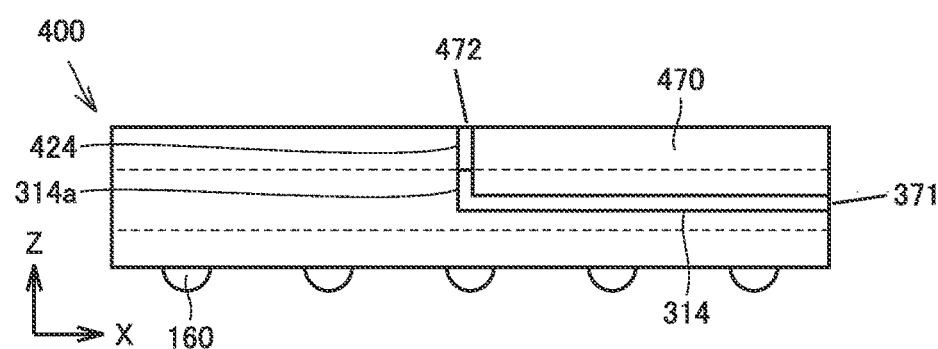
FIG. 20 is a diagram of the electronic component module in FIG. 19 viewed in a direction shown with XX.
Figure 21:
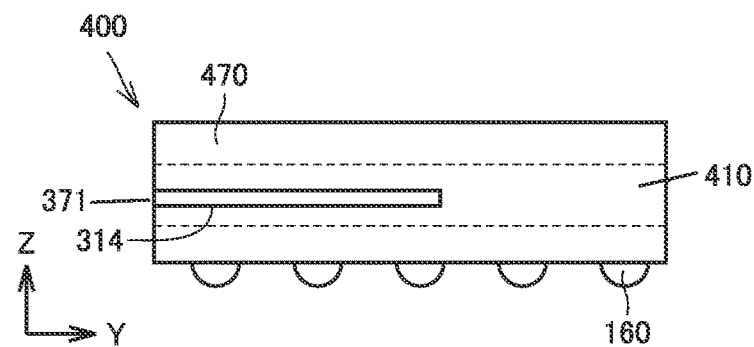
FIG. 21 is a diagram of the electronic component module in FIG. 19 viewed in a direction shown with XXI.

FIG. 19 is a plan view showing a configuration of the electronic component module according to the fourth embodiment of the present disclosure. FIG. 20 is a diagram of the electronic component module in FIG. 19 viewed in a direction shown with XX. FIG. 21 is a diagram of the electronic component module in FIG. 19 viewed in a direction shown with XXI.

As shown in FIGS. 19 to 21, in an electronic component module 400 according to the fourth embodiment of the present disclosure, at least one groove 424 is provided in sealing resin portion 120. A shield 470 is separated by at least one groove 424 in sealing resin portion 120.

Recess 314a is provided only on one end side of recess 314 and not provided on the other end side of recess 314. Groove 424 has one end reaching peripheral side surface 122 of sealing resin portion 120 and has the other end not reaching peripheral side surface 122 of sealing resin portion 120.

In electronic component module 400 according to the fourth embodiment of the present disclosure, shield 470 is not completely separated but partially separated by a first separation portion 371 and a second separation portion 472. Since a path of propagation of electromagnetic waves in shield 470 can be made smaller also in such an embodiment, EMI can effectively be suppressed. Second separation portion 472 is a position where shield 470 is not formed above groove 424.

Fifth Embodiment

An electronic component module according to a fifth embodiment of the present disclosure will be described below with reference to the drawings. The electronic component module according to the fifth embodiment of the present disclosure is different from electronic component module 100 according to the first embodiment of the present disclosure mainly in that the recess is discontinuously provided. Therefore, description of features similar to those in electronic component module 100 according to the first embodiment of the present disclosure will not be repeated.

Figure 22:
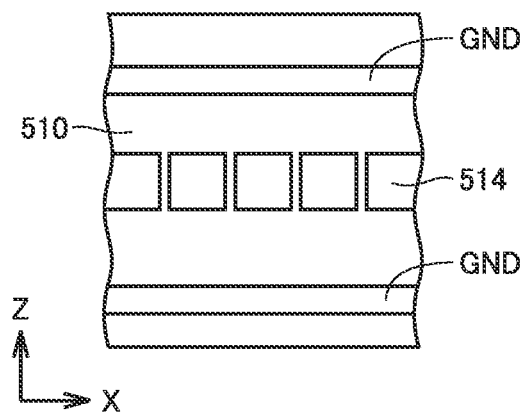
FIG. 22 is an enlarged view of a part of the peripheral side surface of the module substrate of an electronic component module according to a fifth embodiment of the present disclosure.

FIG. 22 is an enlarged view of a part of the peripheral side surface of the module substrate of the electronic component module according to the fifth embodiment of the present disclosure. As shown in FIG. 22, in the electronic component module according to the fifth embodiment of the present disclosure, a plurality of recesses 514 are provided at a distance from one another as being aligned along first surface 111 or second surface 112. Therefore, in the shield, a plurality of first separation portions separated into the first surface 111 side and the second surface 112 side by recesses 514 are formed at a distance from each other as being aligned.

In the electronic component module according to the fifth embodiment of the present disclosure, the shield is not completely separated but partially separated. Since a path of propagation of electromagnetic waves in the shield can be made smaller also in such an embodiment, EMI can effectively be suppressed.

Figure 23:
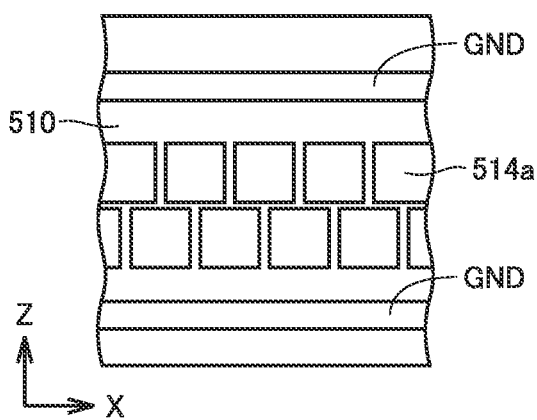
FIG. 23 is an enlarged view of a part of the peripheral side surface of the module substrate of the electronic component module according to a modification of the fifth embodiment of the present disclosure.

Arrangement of recesses 514 is not limited as above. FIG. 23 is an enlarged view of a part of the peripheral side surface of the module substrate of the electronic component module according to a modification of the fifth embodiment of the present disclosure. As shown in FIG. 23, in the electronic component module according to the modification of the fifth embodiment of the present disclosure, a plurality of recesses 514a are arranged as being alternately aligned in two rows along first surface 111 or second surface 112. Recess 514a located in the first row and recess 514a located in the second row are only partially superimposed on each other in circumferential position of a module substrate 510.

Thus, in the shield, a plurality of first separation portions separated into the first surface 111 side and the second surface 112 side by recesses 514a are formed at a distance from each other as alternately being aligned in two rows. In this case, a path of propagation of electromagnetic waves that connects the first surface 111 side and the second surface 112 side to each other in the shield can be made smaller and longer, and hence EMI can effectively be suppressed.

Sixth Embodiment

An electronic component module according to a sixth embodiment of the present disclosure will be described below with reference to the drawings. The electronic component module according to the sixth embodiment of the present disclosure is different from electronic component module 100 according to the first embodiment of the present disclosure mainly in including an antenna circuit. Therefore, description of features similar to those in electronic component module 100 according to the first embodiment of the present disclosure will not be repeated.

Figure 24:
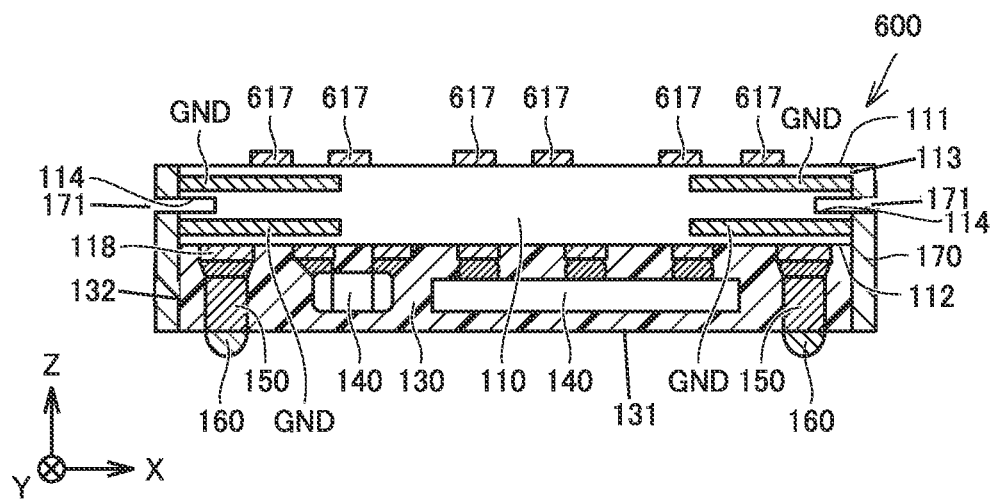
FIG. 24 is a cross-sectional view showing a configuration of an electronic component module according to a sixth embodiment of the present disclosure.

FIG. 24 is a cross-sectional view showing a configuration of the electronic component module according to the sixth embodiment of the present disclosure. FIG. 24 shows the configuration in a cross-section identical to that in FIG. 1.

As shown in FIG. 24, in an electronic component module 600 according to the sixth embodiment of the present disclosure, an antenna circuit 617 is provided on first surface 111. No sealing resin portion is provided on first surface 111, and antenna circuit 617 is not covered with the sealing resin portion. Antenna circuit 617 may be covered with the sealing resin portion.

In electronic component module 600 according to the sixth embodiment of the present disclosure, transmission of electromagnetic waves generated by antenna circuit 617 to electronic component 140 mounted on second surface 112 through shield 170 can be suppressed. Therefore, EMI can effectively be suppressed.

Figure 25:
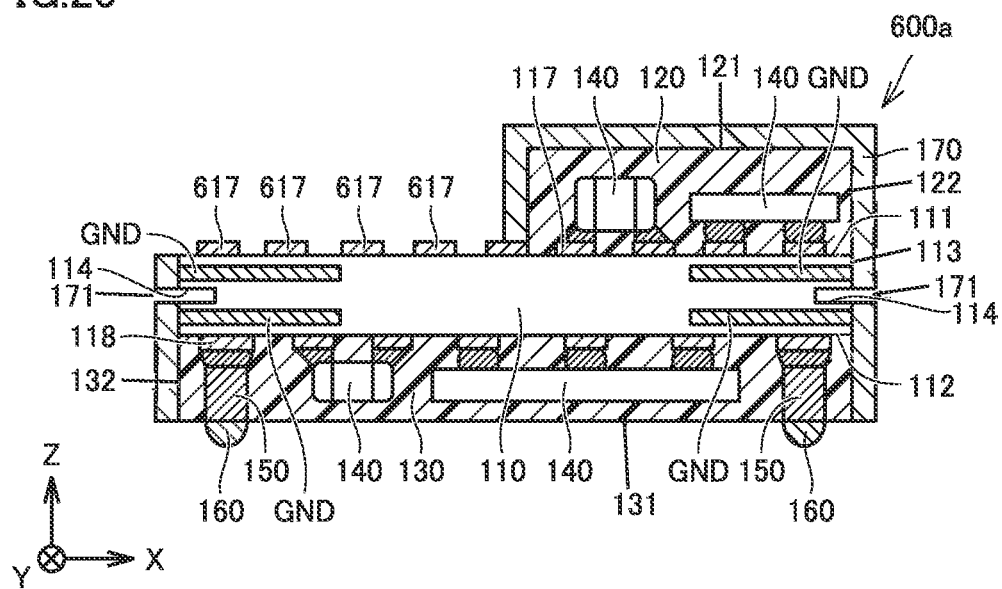
FIG. 25 is a cross-sectional view showing a configuration of an electronic component module according to a modification of the six embodiment of the present disclosure.

Antenna circuit 617 may be provided on first surface 111, and electronic component 140 may be mounted on first surface 111. FIG. 25 is a cross-sectional view showing a configuration of an electronic component module according to a modification of the six embodiment of the present disclosure. FIG. 25 shows the configuration in a cross-section identical to that in FIG. 24.

As shown in FIG. 25, in an electronic component module 600a according to the modification of the sixth embodiment of the present disclosure, antenna circuit 617 is provided on first surface 111 and electronic component 140 is mounted on first surface 111. Sealing resin portion 120 does not cover antenna circuit 617 but covers electronic component 140.

In electronic component module 600a according to the modification of the sixth embodiment of the present disclosure, transmission of electromagnetic waves generated by antenna circuit 617 to electronic component 140 mounted on second surface 112 through shield 170 and to electronic component 140 mounted on first surface 111 through shield 170 can be suppressed. Therefore, EMI can effectively be suppressed.

Antenna circuit 617 should only be provided on at least one of first surface 111 and second surface 112. When antenna circuit 617 is provided on second surface 112, sealing resin portion 130 does not cover antenna circuit 617.

Seventh Embodiment

An electronic component module according to a seventh embodiment of the present disclosure will be described below with reference to the drawings. The electronic component module according to the seventh embodiment of the present disclosure is different from electronic component module 600 according to the sixth embodiment of the present disclosure mainly in that a connector is provided as the connection terminal. Therefore, description of features similar to those in electronic component module 600 according to the sixth embodiment of the present disclosure will not be repeated.

Figure 26:
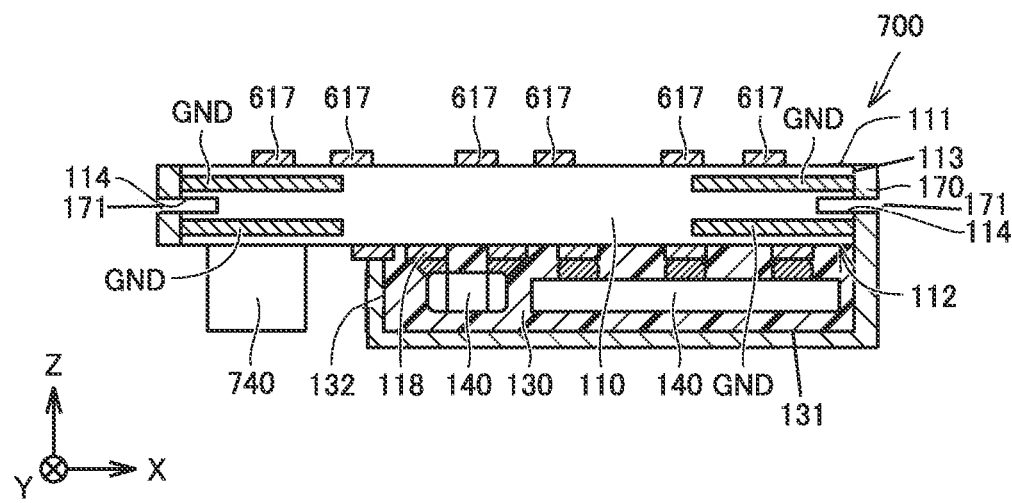
FIG. 26 is a cross-sectional view showing a configuration of an electronic component module according to a seventh embodiment of the present disclosure.

FIG. 26 is a cross-sectional view showing a configuration of the electronic component module according to the seventh embodiment of the present disclosure. FIG. 26 shows the configuration in a cross-section identical to that in FIG. 24.

As shown in FIG. 26, in an electronic component module 700 according to the seventh embodiment of the present disclosure, a connector 740 is provided as the connection terminal on second surface 112. Connector 740 is coupled to a corresponding member provided on the mount substrate. Sealing resin portion 130 does not cover connector 740 but covers electronic component 140.

In electronic component module 700 according to the seventh embodiment of the present disclosure, transmission of electromagnetic waves generated by antenna circuit 617 to electronic component 140 mounted on second surface 112 through shield 170 can be suppressed. Therefore, EMI can effectively be suppressed. Furthermore, electronic component module 700 can readily be mounted on the mount substrate with the use of connector 740.

Figure 27:
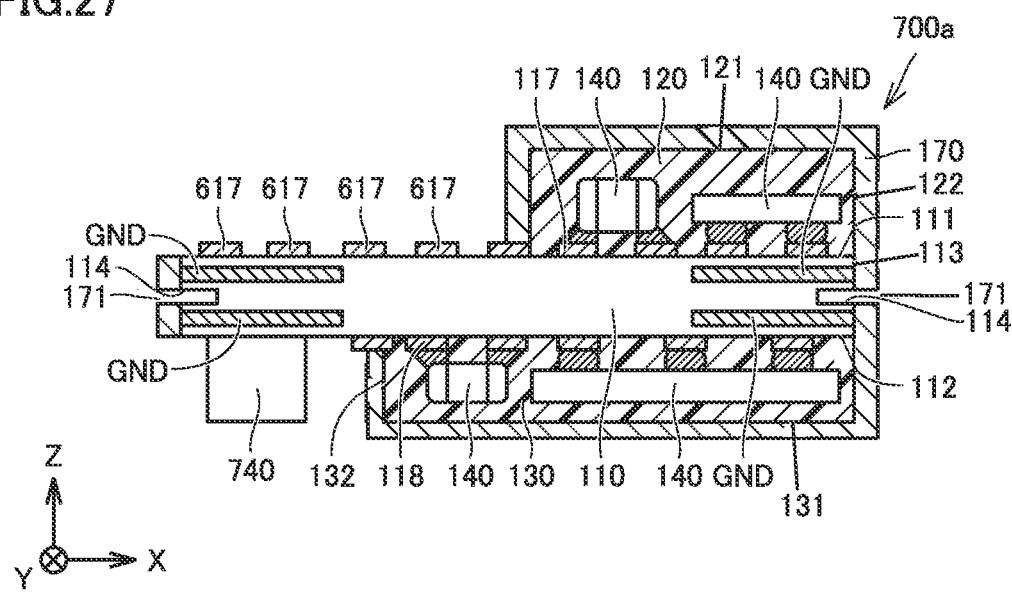
FIG. 27 is a cross-sectional view showing a configuration of an electronic component module according to a modification of the seventh embodiment of the present disclosure.

Antenna circuit 617 may be provided on first surface 111 and electronic component 140 may be mounted on first surface 111. FIG. 27 is a cross-sectional view showing a configuration of an electronic component module according to a modification of the seventh embodiment of the present disclosure. FIG. 27 shows the configuration in a cross-section identical to that in FIG. 26.

As shown in FIG. 27, in an electronic component module 700a according to the modification of the seventh embodiment of the present disclosure, antenna circuit 617 is provided on first surface 111 and electronic component 140 is mounted on first surface 111. Sealing resin portion 120 does not cover antenna circuit 617 but covers electronic component 140.

In electronic component module 700a according to the modification of the seventh embodiment of the present disclosure, transmission of electromagnetic waves generated by antenna circuit 617 to electronic component 140 mounted on second surface 112 through shield 170 and to electronic component 140 mounted on first surface 111 through shield 170 can be suppressed. Therefore, EMI can effectively be suppressed.

Connector 740 should only be provided on at least one of first surface 111 and second surface 112. When connector 740 is provided on first surface 111, sealing resin portion 120 does not cover connector 740.

In the description of the embodiments above, features that can be combined may be combined with one another.

It should be understood that the embodiments disclosed herein are illustrative and non-restrictive in every respect. The scope of the present disclosure is defined by the terms of the claims rather than the description above and is intended to include any modifications within the scope and meaning equivalent to the terms of the claims.

100, 200, 300, 400, 600, 600a, 700, 700a electronic component module; 110, 310, 510 module substrate; 110m, 110ma multilayer substrate; 111 first surface; 112 second surface; 113, 122, 132 peripheral side surface; 114, 314, 314a, 314b, 314c, 514, 514a recess; 114v void; 117, 118 electrode terminal; 119 sacrificial layer portion; 120, 130 sealing resin portion; 121, 131 main surface; 140 electronic component; 150 columnar conductor; 160 connection terminal; 170, 270, 370, 470 shield; 171, 371 first separation portion; 260 terminal; 324, 424 groove; 372, 472 second separation portion; 617 antenna circuit; 740 connector; CL cutting line; GND ground electrode

The invention claimed is:

1. An electronic component module comprising:
a module substrate including a first surface, a second surface located opposite to the first surface, and a peripheral side surface connecting the first surface and the second surface to each other, electronic components being mounted on each of the first surface and the second surface;
a sealing resin portion provided on at least one of the first surface and the second surface, the electronic component being sealed with the sealing resin portion; and
a shield provided to cover each of the sealing resin portion and the peripheral side surface, wherein
the module substrate is provided with a ground electrode, the shield is connected to the ground electrode, and
a recess is located along the peripheral side surface, such that the shield is separated into a first surface side and a second surface side.

2. The electronic component module according to claim 1, wherein
the sealing resin portion is provided on each of the first surface and the second surface.

3. The electronic component module according to claim 1, wherein
at least one of the first surface and the second surface is provided with an antenna circuit.

4. The electronic component module according to claim 1, wherein
at least one of the first surface and the second surface is provided with a connector as a connection terminal.

5. An electronic component module comprising
a module substrate including a first surface, a second surface located opposite to the first surface, and a peripheral side surface connecting the first surface and the second surface to each other, an electronic component being mounted on at least one of the first surface and the second surface;
a sealing resin portion provided on at least one of the first surface and the second surface, the electronic component being sealed with the sealing resin portion; and
a shield provided to cover each of the sealing resin portion and the peripheral side surface, wherein
the module substrate is provided with a ground electrode, the shield is connected to the ground electrode, and
on the peripheral side surface, the shield is separated into a first surface side and a second surface side,
wherein
the peripheral side surface is provided with at least one recess, and
on the peripheral side surface, the shield is separated into the first surface side and the second surface side by the at least one recess.

6. The electronic component module according to claim 5, wherein
the peripheral side surface is provided with a surrounding groove as the at least one recess, the surrounding groove extending around the peripheral side surface by one round.

7. The electronic component module according to claim 5, wherein
the peripheral side surface is provided with a plurality of recesses as the at least one recess, the plurality of recesses being located at a distance from one another.

8. The electronic component module according to claim 5, wherein
the at least one recess includes a portion extending in a plane direction of the module substrate and a portion extending in a thickness direction of the module substrate.

9. The electronic component module according to claim 5, wherein
the sealing resin portion is provided with a groove, and the shield is separated by the groove and the at least one recess.

10. The electronic component module according to claim 6, wherein
the sealing resin portion is provided with a groove, and the shield is separated by the groove and the at least one recess.

11. The electronic component module according to claim 7, wherein
the sealing resin portion is provided with a groove, and the shield is separated by the groove and the at least one recess.

12. The electronic component module according to claim 8, wherein
the sealing resin portion is provided with a groove, and
the shield is separated by the groove and the at least one recess.

13. The electronic component module according to claim 5, wherein
an electronic component is mounted on the first surface and another electronic component is mounted on the second surface, and
the sealing resin portion is provided on each of the first surface and the second surface.

14. The electronic component module according to claim 6, wherein
an electronic component is mounted on the first surface and another electronic component is mounted on the second surface, and
the sealing resin portion is provided on each of the first surface and the second surface.

15. The electronic component module according to claim 7, wherein
an electronic component is mounted on the first surface and another electronic component is mounted on the second surface, and
the sealing resin portion is provided on each of the first surface and the second surface.

16. The electronic component module according to claim 8, wherein
an electronic component is mounted on the first surface and another electronic component is mounted on the second surface, and
the sealing resin portion is provided on each of the first surface and the second surface.

17. The electronic component module according to claim 9, wherein
an electronic component is mounted on the first surface and another electronic component is mounted on the second surface, and
the sealing resin portion is provided on each of the first surface and the second surface.

18. The electronic component module according to claim 5, wherein
at least one of the first surface and the second surface is provided with an antenna circuit.

19. The electronic component module according to claim 6, wherein
at least one of the first surface and the second surface is provided with an antenna circuit.

20. The electronic component module according to claim 7, wherein
at least one of the first surface and the second surface is provided with an antenna circuit.

* * * * *